(12) United States Patent
Soda et al.

(10) Patent No.: US 11,146,150 B2
(45) Date of Patent: Oct. 12, 2021

(54) MOTOR CONTROL DEVICE AND ROBOT SYSTEM

(71) Applicant: KABUSHIKI KAISHA YASKAWA DENKI, Kitakyushu (JP)

(72) Inventors: Ryuichi Soda, Fukuoka (JP); Kenichi Sadakane, Fukuoka (JP); Keijiro Misu, Fukuoka (JP)

(*) Notice: Subject to any disclaimer, the term of this patent is extended or adjusted under 35 U.S.C. 154(b) by 439 days.

(21) Appl. No.: 16/228,674

(22) Filed: Dec. 20, 2018

(65) Prior Publication Data
US 2019/0115808 A1    Apr. 18, 2019

Related U.S. Application Data

(63) Continuation of application No. PCT/JP2016/069497, filed on Jun. 30, 2016.

(51) Int. Cl.
| | | |
|---|---|---|
| *H02K 11/33* | (2016.01) | |
| *H02M 7/48* | (2007.01) | |
| *H02P 25/16* | (2006.01) | |
| *B25J 9/00* | (2006.01) | |
| *H02K 5/18* | (2006.01) | |
| *H02K 5/20* | (2006.01) | |
| *H02K 5/22* | (2006.01) | |
| *H02K 9/04* | (2006.01) | |

(52) U.S. Cl.
CPC ............ *H02K 11/33* (2016.01); *B25J 9/0009* (2013.01); *H02K 5/18* (2013.01); *H02K 5/20* (2013.01); *H02K 5/225* (2013.01); *H02K 9/04* (2013.01); *H02M 7/48* (2013.01); *H02P 25/16* (2013.01); *H02K 2205/09* (2013.01); *H02K 2211/03* (2013.01)

(58) Field of Classification Search
CPC .......... H02P 25/16; H02K 11/33; H02K 5/20; H02K 5/18; H02K 5/225; H02K 9/04; H02K 2205/09; H02K 2211/03
USPC ........................................................ 310/62
See application file for complete search history.

(56) References Cited

U.S. PATENT DOCUMENTS

| | | | |
|---|---|---|---|
| 2007/0119049 A1 | 5/2007 | Teranaka | |
| 2010/0172098 A1* | 7/2010 | Isoshima | H05K 7/20972 361/697 |
| 2017/0055359 A1* | 2/2017 | Teranaka | B25J 9/161 |

FOREIGN PATENT DOCUMENTS

| | | |
|---|---|---|
| CN | 102862162 | 1/2013 |
| CN | 202906724 | 4/2013 |
| CN | 105099239 | 11/2015 |
| CN | 205070761 | 3/2016 |
| JP | 2002-199740 | 7/2002 |

(Continued)

OTHER PUBLICATIONS

International Preliminary Report on Patentability with Written Opinion dated Jan. 10, 2019 for PCT/JP2016/069497.

(Continued)

*Primary Examiner* — Terrance L Kenerly
(74) *Attorney, Agent, or Firm* — Soei Patent & Law Firm (57) ABSTRACT

A motor control device includes a base board, a drive board including switching devices including switching elements for power conversion, disposed along a plane intersecting the base board, and attached to the base board, and a board including a processor configured to execute computation processing for controlling the switching devices, disposed along a plane intersecting the base board, and attached to the base board.

20 Claims, 6 Drawing Sheets

(56) References Cited

FOREIGN PATENT DOCUMENTS

| JP | 2002199740 | * | 7/2002 | ............ H02M 7/48 |
| JP | 2007-281347 | | 10/2007 | |
| JP | 2009-071992 | | 4/2009 | |
| JP | 2011-135671 | | 7/2011 | |
| WO | 03/105549 | | 12/2003 | |

OTHER PUBLICATIONS

Office Action issued in Japanese patent Application No. P2018-524673, dated Jan. 15, 2019 (with English partial translation).

International Search Report dated Oct. 4, 2016 for PCT/JP2016/069497.

Denso Robotics, "Technology and Humanity", Retrieved from the Internet: URL:https://robotteknik.nu/wp-content/uploads/2016/05/DENSO_brochure-en_15_05.pdf, May 2015.

Kuka Roboter GMBH, "Controller KR C4 compact—Operating Instructions", Retrieved from the Internet: URL: http://www.wtech.com.tw/public/download/manual/kuka/krc4/KUKA%20KR%20C4%200perating%20Instructions.pdf, Apr. 15, 2014.

Yaskawa, "Machine Controller MP2200—User's Manual", Retrieved from the Internet: URL:https://www.yaskawa.com.br/wp-content/uploads/2013/08/Manual_Ingles_MP2200.pdf, Sep. 2004.

Extended Search Report in corresponding European Application No. 16907308.7, dated Jan. 22, 2020.

Office Action issued in Japanese Patent Application No. P2018-524673, dated Oct. 23, 2019 (with English partial translation).

Office Action issued in Japanese Patent Application No. P2018-524673, dated May 28, 2019 (with English Partial Translation).

Office Action issued in Chinese Patent Application No. 201680019078.5, dated Jun. 3, 2019 (with English Full Translation).

Kuka Roboter GMBH, "The control system of the future—KR C4 EN", Retrieved from the Internet: URL:https://www.kuka.com/-/media/kuka-downloads/imported/9cb8e311bfd744b4b0eab25ca883f6d3/kuka_pb_controllers_en.pdf?rev=de40213ea1f14087b61b8abbff3c9f37 [retrieved on Jan. 3, 2020], Jan. 1, 2016.

Office Action issued in European Patent Application No. 16907308.7, dated Jun. 7, 2021.

* cited by examiner

Fig.6 ion is a continuation application of PCT Application No. PCT/JP2016/069497, filed Jun. 30, 2016, the entire contents of which are incorporated herein by reference.

MOTOR CONTROL DEVICE AND ROBOT SYSTEM

CROSS-REFERENCE TO RELATED APPLICATIONS

This application is a continuation application of PCT Application No. PCT/JP2016/069497, filed Jun. 30, 2016, the entire contents of which are incorporated herein by reference.

FIELD

The present disclosure relates to a motor control device and a robot system.

BACKGROUND

Japanese Unexamined Patent Publication No. 2007-281347 discloses a mounting method for vertically installing a sub-circuit board including a motor drive circuit mounted thereon, on a main circuit board including a control circuit mounted thereon.

SUMMARY

Disclosed herein is an example motor control device. The motor control device may include a base board and a drive board including a switching device for power conversion, disposed along a plane intersecting the base board, and attached to the base board. Additionally, the motor control device may include a control board including a processor configured to execute computation processing for controlling the switching device, disposed along a plane intersecting the base board, and attached to the base board.

An example robot system disclosed herein may include a robot including at least one actuator and a motor control device configured to control the actuator. The motor control device includes a base board and a drive board. The drive board includes a switching device for power conversion, disposed along a plane intersecting the base board, and attached to the base board. Additionally, the robot system may include a control board including a processor configured to execute computation processing for controlling the switching device, disposed along a plane intersecting the base board, and attached to the base board.

DETAILED DESCRIPTION

In the following description, with reference to the drawings, the same reference numbers are assigned to the same components or to similar components having the same function, and overlapping description is omitted.

1. Robot System

Figure 1:
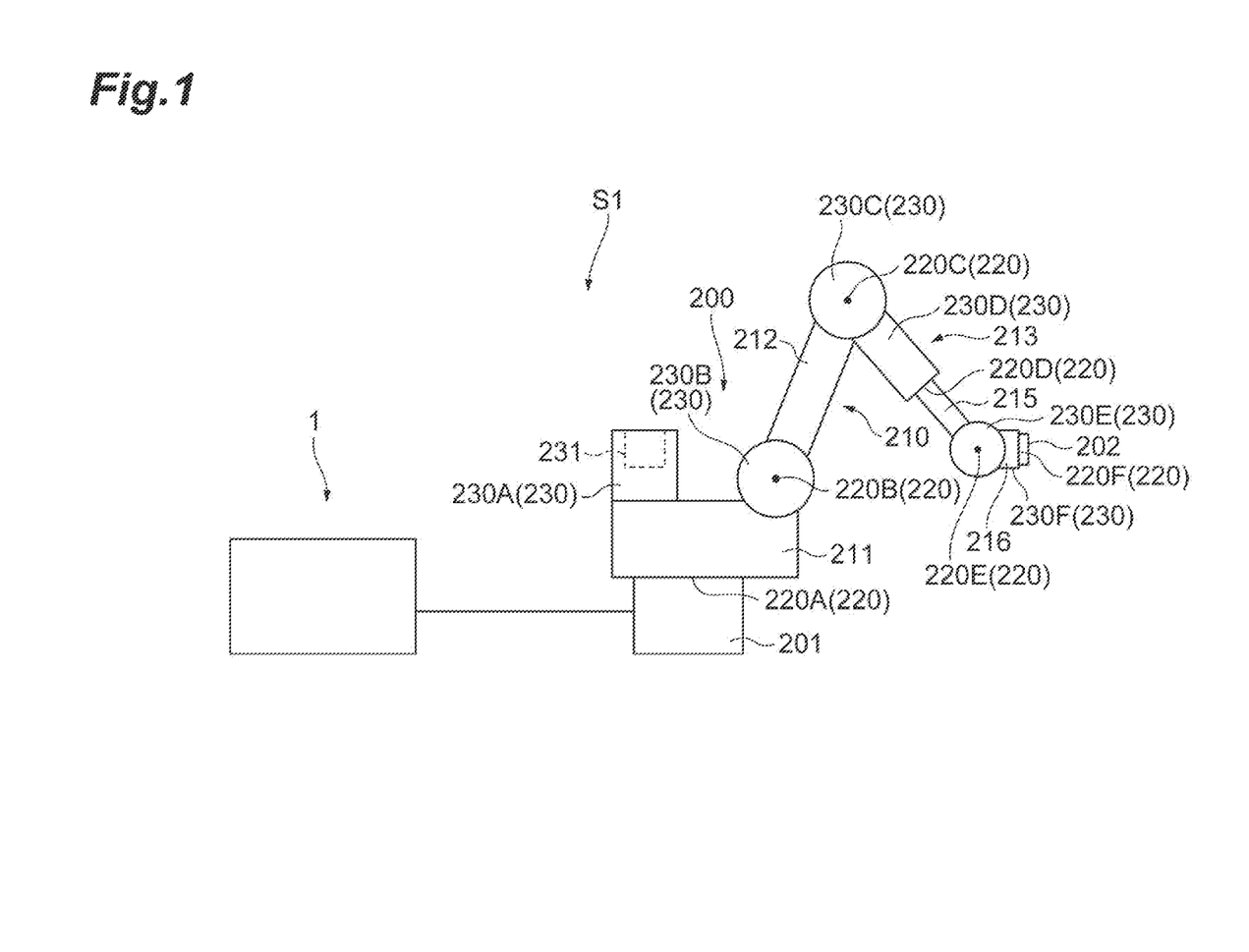
FIG. 1 is a schematic view illustrating an example configuration of a robot system.

As illustrated in FIG. 1, an example robot system S1 includes a robot 200 and a motor control device 1. The robot 200 includes at least one actuator 230. The motor control device 1 controls the actuator 230 of the robot 200. Example configurations of the robot 200 and the motor control device 1 will be described below.

1.1 Robot

The robot 200 includes a base portion 201, a distal end portion 202, an arm portion 210, a plurality of movable portions 220 and a plurality of actuators 230. The arm portion 210 joints the base portion 201 and the distal end portion 202. A plurality of movable portions 220 is aligned along the arm portion 210.

The arm portion 210 includes, for example, a turning portion 211 which is provided on the base portion 201, a first arm portion 212 which is connected to the turning portion 211, a second arm portion 213 which is connected to a distal end portion (an end portion on an opposite side of the base portion 201) of the first arm portion 212, and a third arm portion 216 which is connected to a distal end portion of the second arm portion 213.

A plurality of movable portions 220 may include six movable portions 220A, 220B, 220C, 220D, 220E and 220F. The movable portion 220A makes the turning portion 211 turnable about a vertical axis line passing through the base portion 201. The movable portion 220B makes the first arm portion 212 swingable about an axis line passing through a connection portion of the turning portion 211 and the first arm portion 212. The movable portion 220C makes the second arm portion 213 swingable about an axis line passing through a connection portion of the first arm portion 212 and the second arm portion 213. The movable portion 220D makes a distal end portion 215 of the second arm portion 213 turnable about an axis aligned along the second arm portion 213. The movable portion 220E makes the third arm portion 216 swingable about an axis line passing through a connection portion of the second arm portion 213 and the third arm portion 216. The movable portion 220F makes the distal end portion 202 turnable about an axis aligned along the third arm portion 216. In addition, the number of the movable portions 220 may be six or more (e.g., seven) or may be smaller than six (e.g., four).

A plurality of actuators 230 drives a plurality of movable portions 220, respectively, to displace the distal end portion 215. A plurality of actuators 230 includes, for example, six actuators 230A, 230B, 230C, 230D, 230E and 230F which drive the movable portions 220A, 220B, 220C, 220D, 220E and 220F, respectively.

In addition, driving the movable portion 220 may be understood to include moving a portion which is made movable by the movable portion 220. For example, driving the movable portion 220A may include turning the turning portion 211 which is made movable by the movable portion 220A.

Each of a plurality of actuators 230 includes an electrically powered motor 231 as a power source. An illustrative example of the motor 231 is an alternating-current motor such as a three-phase alternating-current motor.

1.2 Motor Control Device (1) Circuit Configuration

Figure 2:
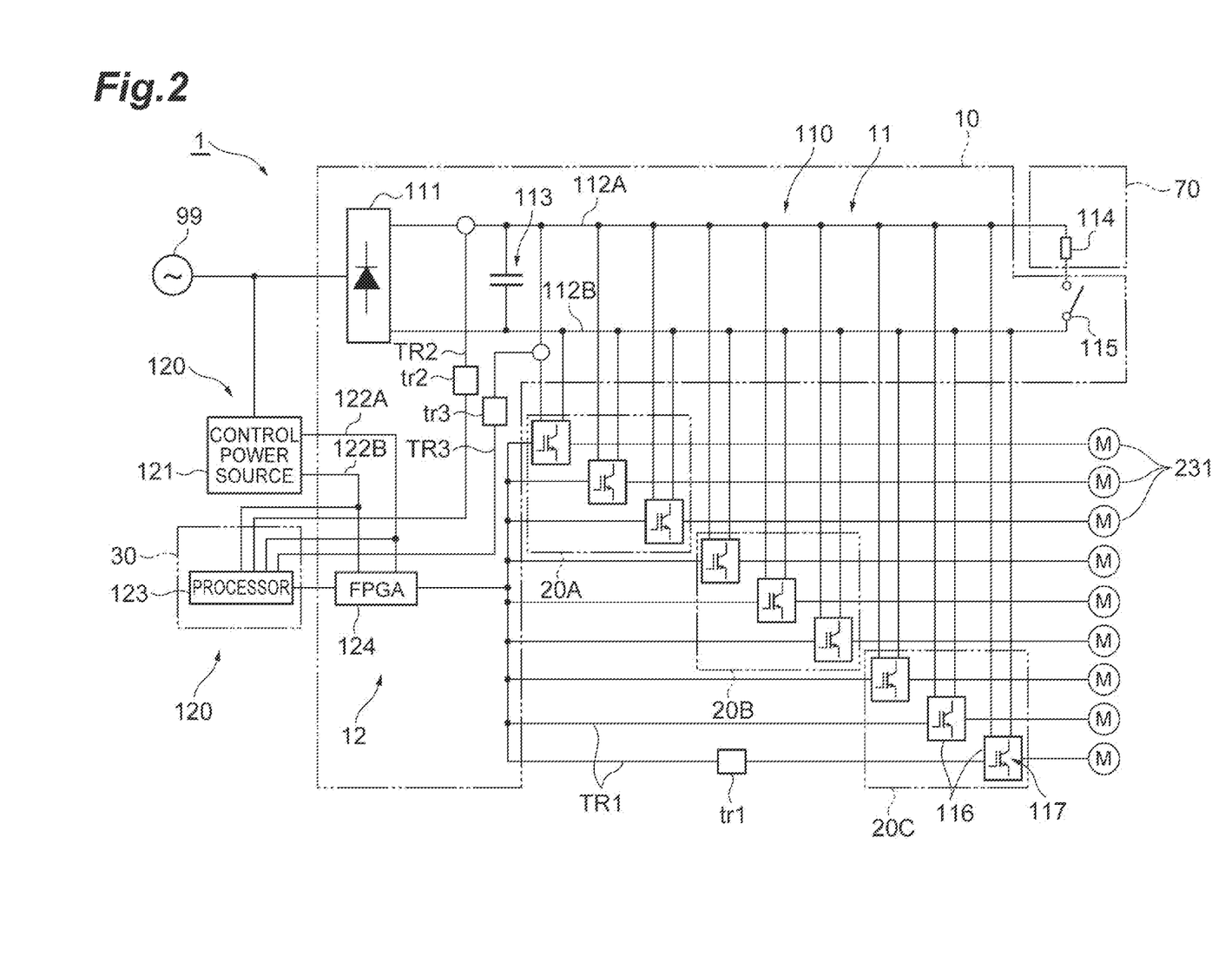
FIG. 2 is a schematic view illustrating an example circuit configuration of a motor control device.

First, an example circuit configuration of the motor control device 1 will be described. The motor control device 1 includes a power system circuit 110 and a control system circuit 120.

The power system circuit 110 selectively generates drive power by power conversion, and supplies the drive power to a load. Examples of the load include the at least one motor 231. For example, the power system circuit 110 can supply the drive power to the nine motors 231 including motors 231A, 231B, 231C, 231D, 231E and 231F of the robot 200.

In some examples, the power system circuit 110 includes a rectifier circuit 111, power lines 112A and 112B (first power lines), a capacitor 113, a resistance element 114, a switch 115 and a plurality of (e.g., nine) electronic components 116 (first electronic components or switching devices).

The rectifier circuit 111 includes a plurality of rectifier elements (e.g., diodes), and converts power from an alternating-current power source 99 into direct current power. The alternating-current power source 99 may be a single phase alternating-current power source or a three-phase alternating-current power source. The power lines 112A and 112B lead the direct current power output from the rectifier circuit 111. The capacitor 113 is provided between the power lines 112A and 112B, and smoothes the voltage between the power lines 112A and 112B. An illustrative example of the capacitor 113 is an electrolytic capacitor. The power system circuit 110 may include a plurality of capacitors 113 between the power lines 112A and 112B.

The resistance element 114 is provided between the power lines 112A and 112B, and consumes regenerative power from the load as thermal energy. The switch 115 is provided between one of the power lines 112A and 112B, and the resistance element 114. The switch 115 may include, for example, a MOSFET (Metal-Oxide-Semiconductor Field-Effect Transistor), and may be configured to switch between a state where the one line and the resistance element 114 are connected and a state where the one line and the resistance element 114 are not connected. Consequently, the current flow through the resistance element 114 may be limited to certain operating conditions such as when the regenerative power is consumed, for example when the motor is commanded to suddenly decelerate or suddenly stop.

A plurality of electronic components 116 outputs drive power to a plurality of motors 231, respectively. Each electronic component 116 includes a plurality of switching elements 117 such as IGBTs (Insulated Gate Bipolar Transistor) (only one is illustrated in FIG. 2 for ease of illustration), and is provided between the power lines 112A and 112B. The electronic component 116 is switched on or off by the switching element 117 to convert the direct current power into alternating-current power between the power lines 112A and 112B and to output the alternating-current power as the drive power to the motor 231.

The control system circuit 120 may be configured to control a plurality of electronic components 116 to selectively output drive power to a plurality of motors 231, respectively. The control system circuit 120 includes a control power source 121, power lines 122A and 122B (second power lines), an electronic component 123 (a second electronic component, a processor or a first processor) and an electronic component 124 (a third electronic component or a second processor).

The control power source 121 converts power from the alternating-current power source 99 into direct current power at the voltage for the control system circuit 120. The power lines 122A and 122B lead the direct current power output from the control power source 121.

The electronic component 123 executes computation processing for controlling the electronic components 116. The electronic component 123 includes, for example, a processor, and is configured to obtain a control target value (a target rotation angle or a target rotation speed) of each motor 231, to calculate a torque for making the state of each motor 231 close to the control target value, and to output the torque as a torque target value to the electronic component 124.

The electronic component 124 executes computation processing for controlling the electronic components 116 in cooperation with the electronic component 123. The electronic component 124 includes, for example, a programmable logic array, and is interposed between the electronic component 123 and the electronic components 116. Additionally, the electronic component 124 is configured to execute processing in response to an input from the electronic component 123. For example, the electronic component 124 outputs an on/off command of the switching element 117 to the electronic component 116 to output drive power corresponding to the torque target value inputted from the electronic component 123 to each motor 231.

(2) Structure

Figure 3:
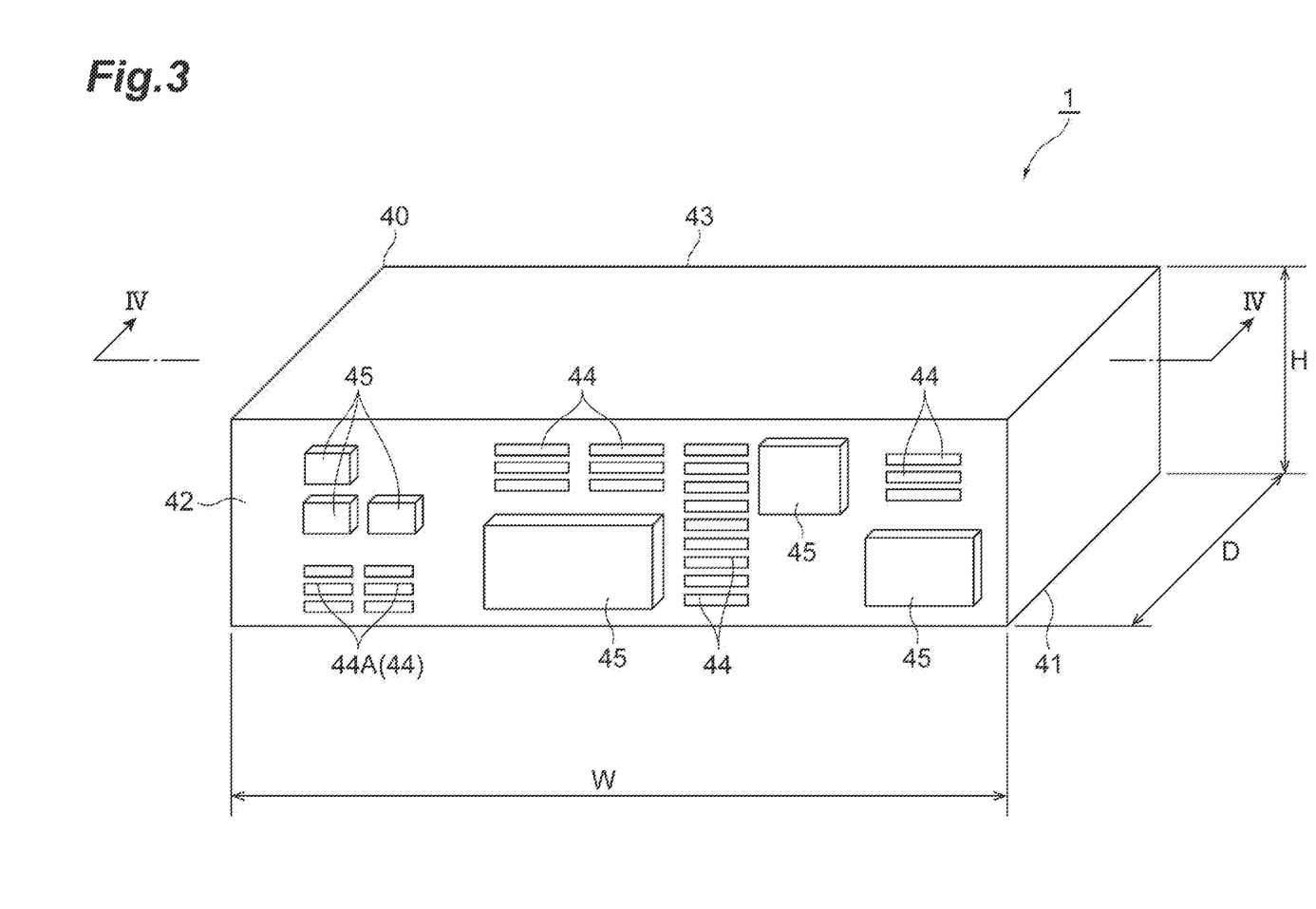
FIG. 3 is a perspective view illustrating an example motor control device.
Figure 4:
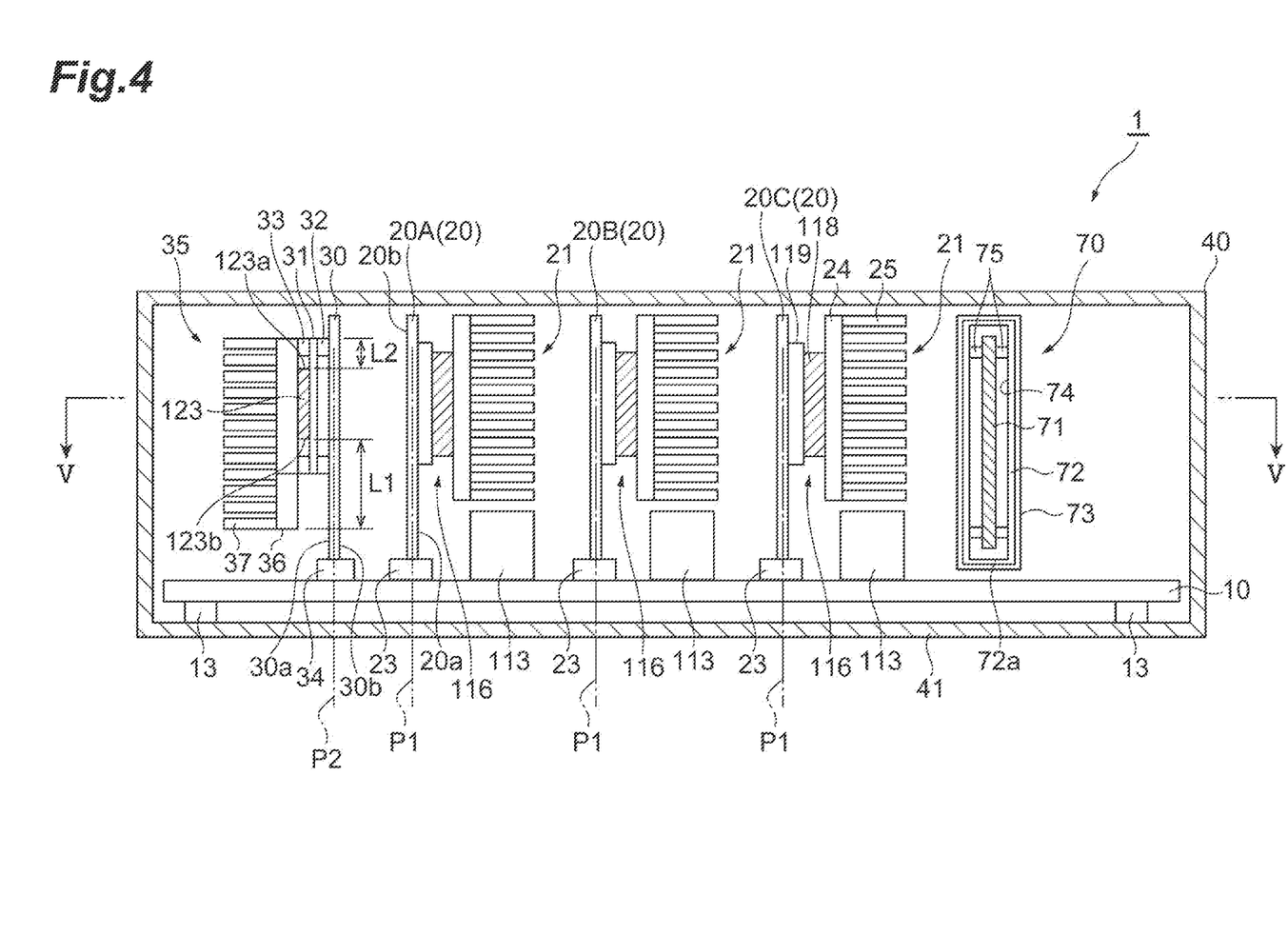
FIG. 4 is a cross-sectional view of the example motor control device taken along a IV-IV line in FIG. 3.
Figure 5:
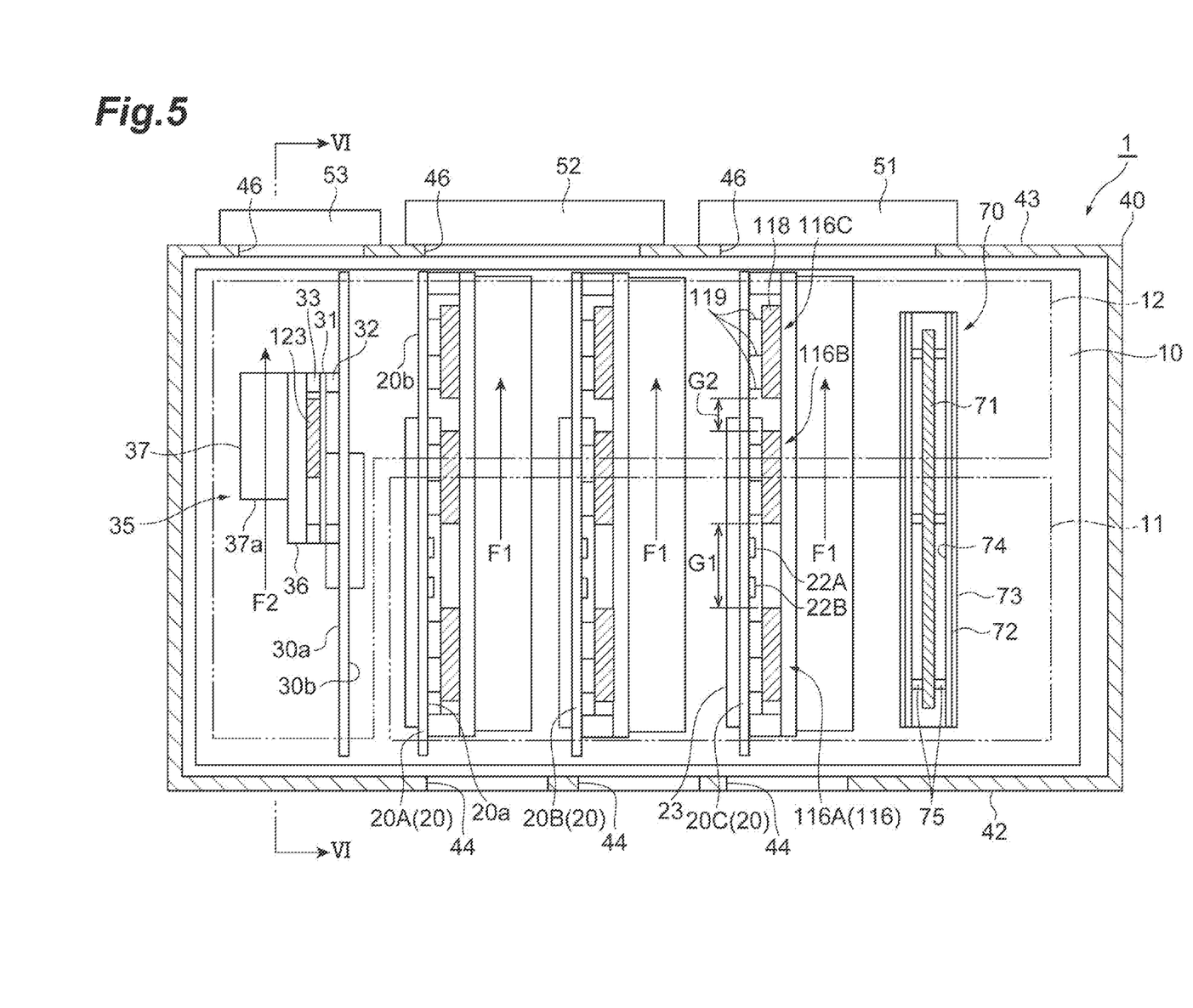
FIG. 5 is a cross-sectional view of the example motor control device taken along a V-V line in FIG. 4.

Next, an example mechanical structure of the motor control device 1 will be described. As illustrated in FIGS. 3 to 5, the motor control device 1 includes a board 10 (a first board or a base board), boards 20 (second boards or drive boards), a board 30 (a third board or a control board), a case 40, two blowers 51 and 52 (a first blower) and a blower 53 (a second blower).

The case 40 includes a wall portion (a first wall portion) in which vent holes are formed, and houses the boards 10, 20 and 30. For example, the case 40 includes an external shape of a rectangular parallelepiped as illustrated in FIG. 3, and includes six panels which form six surfaces of the external shape. A panel located on a lower side in FIG. 3 is referred to as a bottom panel 41 (a bottom portion) below. A panel on a front side in FIG. 3 is referred to as a front panel 42 (a first wall portion). A panel on a rear side opposite the front side in a depth direction of the case 40 in FIG. 3 is referred to as a rear panel 43 (a second wall portion). A panel located on an upper side in FIG. 3 is referred to as a top panel. Panels on left and right sides in FIG. 3 are referred to as side panels. Furthermore, "upper and lower sides", the "width", the "depth" and the "height" mean the "upper and lower sides", the "width", the "depth" and the "height" of an arrangement in FIG. 3. In addition to the illustrated state, the motor control device 1 may be installed in a state where, for example, the bottom panel 41 is vertically installed in some cases. The two or more panels among the six panels may be integrally formed with each other. For example, the bottom panel 41 may be integrally formed with the two side panels.

In some examples, a width W of the case 40 is large compared to a depth D of the case 40. Additionally, a height H of the case 40 may be small compared to the depth D of the case 40. The relationships between the width W, the depth D and the height H are illustrative examples, and the case 40 may include other dimensions and relationships.

The front panel 42 includes a plurality of vent holes 44 and a plurality of connectors 45. The vent holes 44 penetrate the front panel 42, and enable ventilation between the inside and the outside of the case 40. A plurality of connectors 45 is used to connect with each motor 231, to connect with the alternating-current power source 99 and to connect with a host control device (not illustrated).

The rear panel 43 includes a plurality of vent holes 46. The vent holes 46 penetrate the rear panel 43, and enable ventilation between the inside and the outside of the case 40.

The blowers 51, 52 and 53 generate air currents which pass through the case 40 via the vent holes 44 and 46 in a depth direction of the case. For example, the blowers 51, 52 and 53 generate air currents which pass through the case 40 from the front panel 42 to the rear panel 43. That is, the blowers 51, 52 and 53 generate air currents which enter the case 40 from the vent holes 44, and exit from the vent holes 46 to the outside of the case 40.

For example, the blowers 51, 52 and 53 are fixed to an outer side of the rear panel 43 in a state where the blowers 51, 52 and 53 are aligned in a width direction of the case. The blowers 51 and 52 generate air currents which contact a heat radiator 21 described below. The blower 53 generates an air current which contacts a heat radiator 35 described below. In addition, the blowers 51, 52 and 53 may be fixed to the inner side of the rear panel 43, or may be fixed to the outer side or the inner side of the front panel 42.

As illustrated in FIGS. 4 and 5, the board 10 has, for example, a rectangular shape, and is disposed on the bottom panel 41 such that four sides of the board 10 are along the four sides of the bottom panel 41. Additionally, the board 10 is fixed to the bottom panel 41 with a plurality of spacers 13 interposed therebetween.

The board 10 includes the at least one electronic component 124 (see FIG. 2). The board 10 includes, for example, a circuit 11 (a first circuit or a drive circuit) which is connected to the electronic components 116, a circuit 12 (a second circuit or a control circuit) which is connected to the electronic component 123 and located apart from the circuit 11, and at least one transmission router TR (a transmitter). The transmission router TR may be configured to transmit a signal between the circuit 11 and the circuit 12 in a state where the circuit 11 and the circuit 12 are electrically insulated.

The circuit 11 includes, for example, the rectifier circuit 111, the power lines 112A and 112B, the capacitor 113 and the switch 115. The circuit 12 includes the power lines 122A and 122B and the electronic component 124. The circuits 11 and 12 are formed without overlapping each other seen from a direction (an upper side or a lower side in FIG. 3) perpendicular to the board 10, and a gap is provided between the circuits 11 and 12 (see FIG. 5).

The at least one transmission router TR includes, for example, transmission routers TR1, TR2 and TR3 illustrated in FIG. 2. The transmission router TR1 transmits an on/off command of the switching element 117 from the electronic component 124 to the electronic component 116 via an insulation type signal transmission element tr1 such as a photocoupler.

The transmission router TR2 transmits a signal related to a voltage and a current between the power lines 112A and 112B to the electronic component 123 via an insulation type signal transmission element tr2 such as a photocoupler. The signal transmitted by the transmission router TR2 is used to detect an abnormality, for example.

The transmission router TR3 transmits to the electronic component 123 a signal related to an input current from the power lines 112A and 112B to each electronic component 116 via an insulation type signal transmission element tr3 such as a photocoupler. The signal transmitted by the transmission router TR3 is used as, for example, a control feedback signal. Furthermore, the signal transmitted by the transmission router TR3 can be also used to detect an abnormality.

The boards 20 are disposed along a plane P1 intersecting (e.g., perpendicular to) the board 10, and are attached to the board 10. The board 30 is disposed along a plane P2 intersecting (e.g., perpendicular to) the board 10, and is attached to the board 10. The planes P1 and P2 may be substantially parallel to each other. That is, the boards 20 and 30 are upright with respect to the board 10, and are, in a state of being disposed along the same direction with each other, aligned in a direction substantially perpendicular to the board 10. For example, the boards 20 and the board 30 have substantially rectangular shapes that are aligned in a width direction of the case 40 such that the longest side of each board is oriented along the depth direction of the case 40. In addition, the rectangular shape of the boards 20 and 30 includes a protruding connector and cutouts for wiring cable at a periphery. In addition, the inclination of the boards 20 and 30 may include an error level or slight deviation with respect to the parallel orientation described above.

The board 20 includes the at least one electronic component 116. The board 20 additionally includes, for example, a plurality of electronic components 116, the heat radiator 21 (a first heat radiator or a switching device cooler), power lines 22A and 22B (third power lines) and a connector 23.

The electronic component 116 is fixed to a surface 20a of the board 20 that faces away from the board 30. The electronic component 116 includes, for example, a package 118 including a plurality of switching elements 117, and a plurality of terminals 119. A plurality of terminals 119 is connected to a conductive line (not illustrated) on the surface 20a. In addition, the electronic component 116 may be fixed to a surface 20b of the board 20 that faces toward the board 30.

A plurality of electronic components 116 is aligned along a direction intersecting the front panel 42, and is aligned from a windward side to a leeward side of air currents F1 of the above blowers 51 and 52. For example, a plurality of electronic components 116 is aligned from the side of the front panel 42 to the side of the rear panel 43 along the depth direction of the case 40. A plurality of electronic components 116 may include the at least three electronic components 116. Hereinafter, as appropriate, the plurality of electronic components 116 are distinguished as an electronic component 116A (e.g., a first electronic component 116A), an electronic component 116B (e.g., a second electronic component 116B) and an electronic component 116C (e.g., a third electronic component 116C). The electronic components 116A, 116B and 116C are aligned from the side of the front panel 42 to the side of the rear panel 43.

Upper limits of output power of the plurality of electronic components 116 may be different from each other. For example, the upper limits of the output power may be different from each other according to a specification of the electronic components 116 (e.g. maximum rated output) which are different from each other, but also a case where the upper limits of the output power of software settings for controlling the electronic components 116 by the electronic components 123 and 124 are different from each other.

For example, the upper limit of the output power of the electronic component 116 located closest to the front panel 42 may be larger than the upper limits of the output power of the other electronic components 116. When the board 20 includes the three electronic components 116A, 116B and 116C, the upper limit of the output power of the electronic component 116A may be larger than the upper limits of the output power of the electronic components 116B and 116C.

In some examples, the plurality of electronic components 116 may include two electronic components 116, and an electronic component which is located between the two electronic components 116 and has a smaller upper limit of the output power than those of the two electronic components 116. When the board 20 includes the three electronic components 116A, 116B and 116C, the upper limit of the output power of the electronic component 116B may be smaller than the upper limits of the output power of the electronic components 116A and 116C.

The arrangement of the plurality of electronic components 116 may be modified in arrangement. For example, the upper limit of the output power of the electronic component 116 located closest to the rear panel 43 may be larger than the upper limits of the output power of the other electronic components 116. When the board 20 includes the three electronic components 116A, 116B and 116C, the upper limit of the output power of the electronic component 116C may be larger than the upper limits of the output power of the electronic components 116A and 116B.

Furthermore, the upper limit of the output power of the electronic component 116 located closest to the front panel 42 may be smaller than the upper limits of the output power of the other electronic components 116. When the board 20 includes the three electronic components 116A, 116B and 116C, the upper limit of the output power of the electronic component 116A may be smaller than the upper limits of the output power of the electronic components 116B and 116C.

The plurality of electronic components 116 may include two electronic components which are adjacent at an interval G1 (a first interval), and two electronic components which are adjacent at an interval G2 (a second interval) shorter than the interval G1. For example, the electronic component 116 located closest to the front panel 42 and the second closest electronic component 116 from the side of the front panel 42 may be adjacent at the interval G1, whereas the second closest electronic component 116 and the third closest electronic component 116 to the front panel 42 may be adjacent at the interval G2. When, for example, the board 20 includes the three electronic components 116A, 116B and 116C, the electronic component 116A and the electronic component 116B may be adjacent at the interval GL, and the electronic component 116B and the electronic component 116C may be adjacent at the interval G2. In this case, the three electronic components 116 include the two electronic components 116A and 116B which are adjacent at the interval G1, and the two electronic components 116B and 116C which are adjacent at the interval G2. On the other hand, in some examples the electronic component 116 (e.g., electronic component 116C) located closest to the rear panel 43, and the second closest electronic component 116 (e.g., electronic component 116B) from the rear panel 43 may be adjacent at the interval G1, and the second and third closest electronic components 116 (e.g., electronic components 116B and 116A, respectively) to the rear panel 43 may be adjacent at the interval G2.

The power lines 22A and 22B are connected to the power lines 112A and 112B of the board 10, respectively, and are connected to a plurality of electronic components 116 on the board 20. In some examples, the power lines 22A and 22B are interposed between the power lines 112A and 112B and a plurality of electronic components 116. The power lines 22A and 22B may be wired so as to pass through a region between the two electronic components 116 adjacent at the interval G1. When, for example, the electronic component 116 (e.g., electronic component 116A) closest to the front panel 42 and the second closest electronic component 116 (e.g., electronic component 116B) from the front panel 42 are adjacent at the interval G1, the power lines 22A and 22B may be wired between the electronic component 116 located closest to the front panel 42 and the second closest electronic component 116 from the front panel 42.

The connector 23 is connected to the board 10. For example, the connector 23 is provided at a lower portion of the board 20 to connect a conductive line of the board 20 including the power lines 22A and 22B, and a conductive line of the board 10 including the power lines 112A and 112B.

The connector 23 may be provided in a direction (a depth direction) in which a plurality of electronic components 116 is aligned. Additionally, the connector 23 may be provided at a position at which at least part of the connector 23 overlaps a region between the two electronic components 116 (e.g., between the electronic component 116A and the electronic component 116B) which are adjacent at the interval G1.

The heat radiator 21 is in contact with at least two of the electronic components 116 which have different upper limits of output power from each other among a plurality of electronic components 116. For example, the heat radiator 21 includes a base 24 and a plurality of heat radiator fins 25. The base 24 is fixed to the board 20 with a plurality of spacers 32 interposed therebetween in a state where the base 24 is in contact with the packages 118 of all of the electronic components 116. A plurality of heat radiator fins 25 is aligned in a height direction, and protrudes from the base 24 toward the opposite side of the packages 118. Additionally, the plurality of heat radiator fins 25 is aligned along the depth direction. Consequently, the air currents F1 of the blowers 51 and 52 can pass between the heat radiator fins 25 along the depth direction. A material of the heat radiator 21 includes an aluminum-based or copper-based metal material.

A plurality of electronic components 116 and the heat radiator 21 may be unevenly disposed on the board 20 in a direction apart from the board 10. For example, the electronic components 116 and the heat radiator 21 may be unevenly disposed on an upper side of the board 20. In some examples, the capacitor 113 of the board 10 may be disposed at a position at which the capacitor 113 overlaps the heat radiator 21 seen from a direction perpendicular to the board 10. The capacitor 113 may be located below the heat radiator 21.

A plurality of boards 20 may be attachable to the board 10. For example, the three boards 20 aligned in the width direction are attachable to the board 10. The board 10 may include slots to which the boards 20 are attached at three portions aligned in the width direction. In some examples, three boards 20A, 20B and 20C are attached to the board 10, and each of the boards 20A, 20B and 20C includes the three electronic components 116. Thus, the power system circuit 110 including nine electronic components 116 is formed.

In some examples, when the control target of the motor control device 1 is the robot 200, two of the boards 20A, 20B and 20C (e.g., the boards 20A and 20B) may be used to control the robot 200. An example association between the six electronic components 116 of the boards 20A and 20B and the six motors 231 of the robot 200 will be described in further detail below.

The electronic component 116 located closest to the front panel 42 (e.g., the closest electronic component of the board 20A and the board 20B) may be associated with the movable portion 220 that is closer to the side of the base portion 201 than the movable portions 220 associated with the other electronic components 116. In addition, the association with the movable portion 220 may be understood to include a connection with the motor 231 of the actuator 230 which drives the movable portion 220.

In some examples, the electronic component 116A of the board 20A is allocated to the movable portion 220A located closest to the base portion 201 among a plurality of movable portions 220. The electronic component 116A of the board 20B is allocated to the movable portion 220B located second closest from the base portion 201 among the plurality of movable portions 220.

An intermediate electronic component located between two electronic components 116 of at least one of the boards 20A and 20B may be associated with the movable portion 220 closer to the distal end portion 202 than the movable portions 220 associated with the two electronic components 116 located on both sides of the intermediate electronic component.

For example, the electronic component 116A of the board 20A is allocated to the movable portion 220A located closest to the base portion 201 among a plurality of movable portions 220. The electronic component 116C of the board 20A is allocated to the movable portion 220D located in fourth closest from the base portion 201 among a plurality of movable portions 220. The electronic component 116B of the board 20A is allocated to the movable portion 220F located closest to the distal end portion 202 among a plurality of movable portions 220. The electronic component 116A of the board 20B is allocated to the movable portion 220B located second closest from the base portion 201 among a plurality of movable portions 220. The electronic component 116C of the board 20B is allocated to the movable portion 220C located third closest from the base portion 201 among a plurality of movable portions 220. The electronic component 116B of the board 20B is allocated to the movable portion 220E located fifth closest from the base portion 201 (or second closest from the distal end portion 202) among a plurality of movable portions 220.

The blowers 51 and 52 are disposed such that the air currents F1 are in contact with the heat radiator 21 of each board 20. For example, the blowers 51 and 52 are disposed to generate the air currents F1 at positions in contact with the heat radiator 21. The blowers 51 and 52 may be disposed such that at least part of each heat radiator 21 overlaps one of the blowers 51 and 52 seen from the direction perpendicular to the front panel 42.

In some examples, the board 10 may include a plurality of capacitors 113 disposed in a dispersed manner below the heat radiators 21 of a plurality of boards 20. When the plurality of capacitors 113 is disposed below the one heat radiator 21, the plurality of capacitors 113 may be disposed to align along the depth direction of the case 40.

The board 30 includes the at least one electronic component 123. In some examples, the board 30 includes the one electronic component 123, a connector 34 and the heat radiator 35 (a second heat radiator or a processor cooler).

The electronic component 123 is fixed to a surface 30a of the board 30 which faces away from the board 20. The electronic component 123 may be fixed to the surface 30a by mounting the electronic component 123 to a processor board 31 which is attached to the board 30. For example, the electronic component 123 is fixed to the processor board 31, and the processor board 31 is fixed to the surface 30a of the board 30 with a plurality of spacers 32 interposed therebetween. In some examples, the electronic component 123 may be disposed on an opposite side of the board 30. The electronic component 123 may be fixed to a surface 30b of the board 30 which faces toward the board 20.

The connector 34 is connected to the board 10. For example, the connector 34 is provided at a lower portion of the board 30 to connect a conductive line of the board 30 and the conductive line of the board 10 including the power lines 122A and 122B.

The heat radiator 35 is in contact with the electronic component 123. For example, the heat radiator 35 includes a base 36 and a plurality of heat radiator fins 37. The base 36 includes, for example, a flat body that is in contact with the electronic component 123 in a state where the base 36 is parallel to the board 30. The base 36 is fixed to the processor board 31 with a plurality of spacers 33 interposed therebetween. A plurality of heat radiator fins 37 is aligned in the height direction of the case 40, and protrudes from the base 36 toward the opposite side of the electronic component 123 in a state where the plurality of heat radiator fins 37 is aligned along the depth direction of the case 40. Consequently, an air current F2 of the blower 53 can pass between the heat radiator fins 37 aligned along the depth direction. A material of the heat radiator 35 includes an aluminum-based or copper-based metal material.

The blower 53 is disposed such that the air current F2 is in contact with the heat radiator 35. The blower 53 may be disposed to generate the air current F2 at a position at which the blower 53 is in contact with the heat radiator 35. For example, the blower 53 is disposed such that at least part of the heat radiator 35 overlaps the blower 53 seen from the direction perpendicular to the front panel 42.

Figure 6:
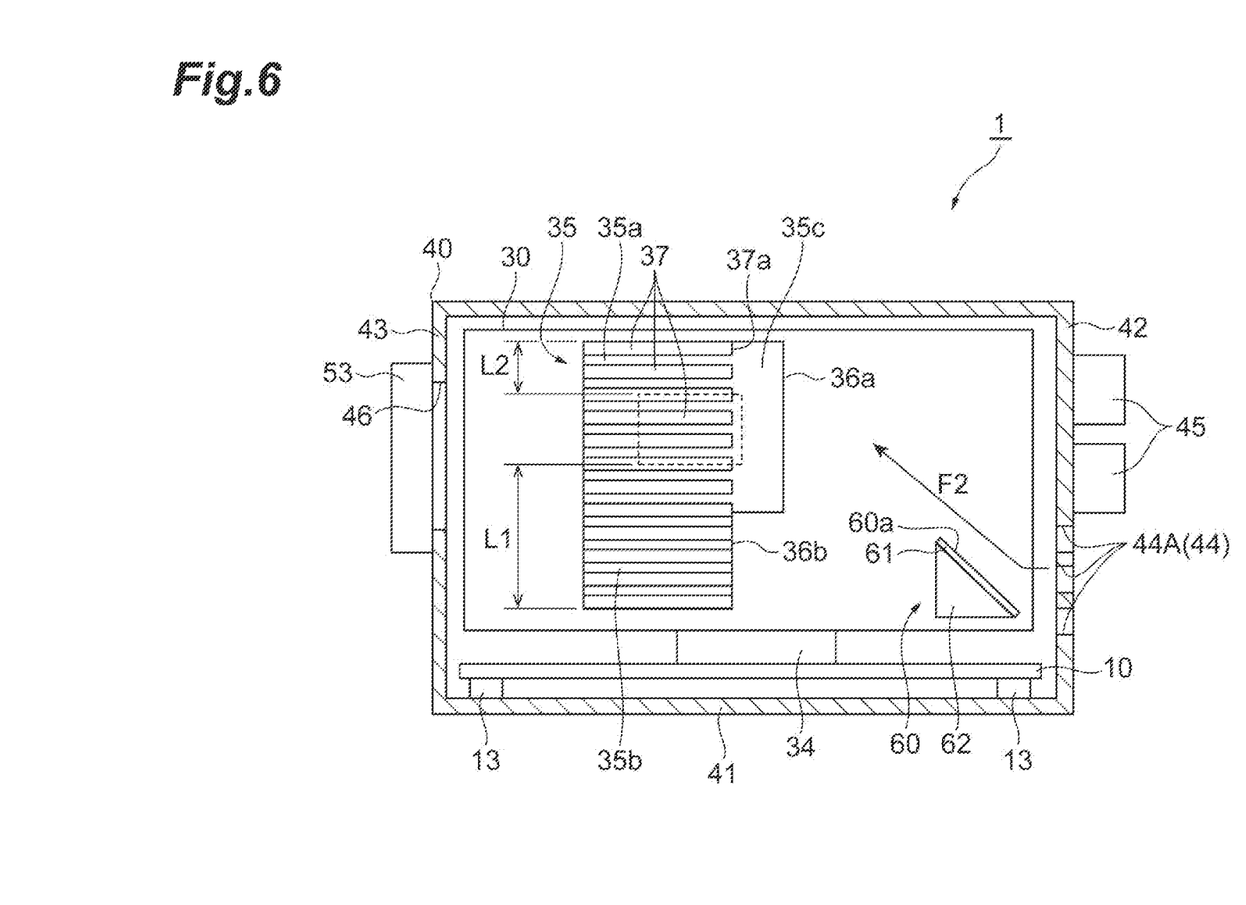
FIG. 6 is a cross-sectional view of the example motor control device taken along a VI-VI line in FIG. 5.

In some examples, the position of the electronic component 123 and the positions of the vent holes 44 are shifted from each other when seen from the direction perpendicular to the front panel 42. For example, the vent holes 44 (referred to as "vent holes 44A" below) are located at positions at which the vent holes 44 overlap the electronic component 123 in the width direction and are located below the electronic component 123 as illustrated in FIG. 6.

In some examples, the motor control device 1 may further include an air guide member 60. The air guide member 60 is configured to guide the air current F2 having entered the case 40 from the vent holes 44A toward the electronic component 123. The electronic component 123 and the air guide member 60 may be disposed at different positions when seen from the direction perpendicular to the front panel 42. For example, the air guide member 60 includes an inclined surface 60a which is provided on a route of the air current F2 below the electronic component 123, and guides the air current F2 toward the electronic component 123. The inclined surface 60a generally faces the front panel 42.

The air guide member 60 may be fixed to the board 30. For example, the air guide member 60 includes a wave guide plate 61 and a connection plate 62. The connection plate 62 is fixed to the surface 30a of the board 30. The wave guide plate 61 protrudes from the connection plate 62 to the opposite side of the board 30 such that one surface forms the inclined surface 60a.

According to a configuration that further includes the air guide member 60, the heat radiator 35 may protrude at different lengths from the rim (an outer periphery) of the electronic component 123 toward the air guide member 60 and toward the opposite side of the air guide member 60 when seen from the direction perpendicular to the front panel 42. For example, a protrusion length of the heat radiator 35 from the rim of the electronic component 123 toward the air guide member 60 when seen from the direction perpendicular to the front panel 42 (referred to as a "protrusion length L1" below) may be longer than a protrusion length of the heat radiator 35 from the rim of the electronic component 123 toward the opposite side of the air guide member 60 (referred to as a "protrusion length L2" below). As shown in FIG. 4, the protrusion length of the heat radiator 35 from a lower rim 123b of the electronic component 123 toward a lower side corresponds to the protrusion length L1, and the protrusion length of the heat radiator 35 from an upper rim 123a of the electronic component 123 toward an upper side corresponds to the protrusion length L2.

Furthermore, as illustrated in FIG. 6, the base 36 of the heat radiator 35 may protrude from a rim 37a of the heat radiator fin 37 on a side of the front panel 42 toward the front panel 42. When the downward protrusion length L of the heat radiator 35 is longer than the upward protrusion length L2 as described above, an upper portion 36a of the base 36 may protrude further toward the front panel 42 as compared to a lower portion 36b of the base 36. For example, the heat radiator 35 includes a first portion 35a which is at least partially in contact with the electronic component 123 and includes a plurality of heat radiator fins 37 protruding toward the opposite side of the electronic component 123. Additionally, the heat radiator 35 may include a second portion 35b which protrudes from the first portion 35a toward the air guide member 60 in a direction along the front panel 42 and includes a plurality of heat radiator fin 37. Still further, the heat radiator 35 may include a third portion 35c which protrudes from the first portion 35a toward the front panel 42 and does not include the heat radiator fin 37.

With reference to FIGS. 4 and 5, the motor control device 1 may further include an electronic component 70 (a fourth electronic component or a passive device). The electronic component 70 includes a main body 71, a cover 72 (a first cover or an inner cover), a cover 73 (a second cover or an outer cover), a ventilation route 74 and a plurality of spacers 75. The main body 71 includes a passive circuit element (a passive element). The passive circuit element of the main body 71 may be used for the configuration of the motor control device 1. In some examples, the passive circuit element of the main body 71 may include the above resistance element 114. The resistance element 114 may be formed by a cement resistor. The main body 71 may have, for example, an external shape of a rectangular flat shape.

The cover 72 covers at least part of the main body 71 and is heated by heat generated by the main body 71. The cover 72 may have conductivity and have higher thermal conductivity than the cover 73. For example, the cover 72 is formed by an aluminum-based metal plate. The cover 72 includes a tubular part 72a which surrounds the main body 71 about an axis line along a longitudinal direction of the main body 71. Both end portions of the tubular part 72a are opened.

The cover 73 has an electrical insulation property, and covers the cover 72 from the opposite side of the main body 71. For example, the cover 73 is formed by a rubber material or a resin material, and closely adheres to the cover 72. When the cover 72 includes the tubular part 72a, the cover 73 may cover the entire circumference of the tubular part 72a.

The ventilation route 74 is formed between the cover 72 and the main body 71. For example, the cover 72 faces the main body 71 with a gap interposed therebetween, and the gap may form the ventilation route 74. The entire circumference of the tubular part 72a of the cover 72 may face the entire circumference of the main body 71 with a gap interposed therebetween. In some examples, the ventilation route 74 passes from one end side to the other end side of the tubular part 72a.

The cover 72 which faces the main body 71 with the gap interposed therebetween as described above is fixed to the main body 71 with a plurality of spacers 75 interposed therebetween. The spacers 75 are interposed between the cover 72 and the main body 71, and are configured to transfer heat from the main body 71 to the cover 72.

The electronic component 70 is connected with one of the boards 10, 20 and 30. For example, the circuit element of the main body 71 is connected to the board 10. When the main body 71 includes the resistance element 114, the main body 71 is connected to the power lines 112A and 112B with the switch 115 interposed therebetween.

The electronic component 70 is fixed to the case 40 in a state where the ventilation route 74 is oriented along the depth direction (a state where the longitudinal direction of the main body 71 is along the depth direction). For example, the electronic component 70 is disposed at a position at which the board 20 is sandwiched between the board 30 and the electronic component 70 such that the main body 71 is parallel to the board 20 and the board 30.

The blowers 51 and 52 may be disposed such that the air currents F1 pass the ventilation route 74. For example, the blower 51 may be disposed such that at least part of the blower 51 overlaps the ventilation route 74 when seen from the direction perpendicular to the front panel 42.

The motor control device 1 includes the board 10, and the board 20 which includes the electronic components 116 for power conversion. The board 20 is disposed along the plane P1 intersecting the board 10, and is attached to the board 10. Additionally, the motor control device 1 includes the board 30 which includes the electronic component 123 which executes computation processing for controlling the electronic components 116. The board 30 is disposed along the plane P2 intersecting the board 10, and is attached to the board 10.

The electronic components 116 and the electronic component 123 are dispersed on the two boards 20 and 30 which intersect the board 10. Consequently, the area of the board 10 may be reduced, and most of a space adjacent to the board 10 may be effectively used for an arrangement of the electronic components 116 and the electronic component 123. Consequently, the motor control device 1 is effective for space saving.

The board 10 may include the electronic component 124 which executes computation processing for controlling the electronic components 116 in cooperation with the electronic component 123. In some examples, by disposing the electronic components 123 and 124 on the different boards in the dispersed manner, cooling efficiency of these electronic components 123 and 124 may be enhanced.

The electronic component 124 may be interposed between the electronic component 123 and the electronic components 116, and may be configured to execute computation processing in response to the input from the electronic component 123. In some examples, the electronic component 124 interposed between the electronic component 123 and the electronic components 116 is disposed on the board 10 interposed between the board 20 and the board 30 in order to simplify the wiring.

The board 10 may include the circuit 11 which is connected to the electronic components 116, and the circuit 12 which is connected to the electronic component 123 and located apart from the circuit 11. Additionally, the board 10 may include the transmission router TR which transmits a signal between the circuit 11 and the circuit 12 in a state where the circuit 11 and the circuit 12 are electrically insulated. In some examples, by separating a formation region of the circuit 11 which forms part of the power system circuit 110 and a formation region of the circuit 12 which forms part of the control system circuit 120, reliability may be enhanced.

The board 20 may include a plurality of electronic components 116 which includes electronic components having a different upper limit of output value from other electronic components 116. Additionally, the board 20 may include the at least one heat radiator 21, and the heat radiator 21 may be in contact with at least two of the electronic components 116 which have at least different upper limits of output power from the other electronic components 116. In some examples, a portion of the heat radiator 21 which is in contact with the electronic component 116 having a smaller heat generation amount can be used for heat radiation of the electronic component 116 having a larger heat generation amount. A portion of the heat radiator 21 located between the electronic components 116 can be used for heat radiation. Consequently, both space savings and efficient cooling may be achieved.

The motor control device 1 may include the front panel 42 in which the vent holes 44 are formed, and houses the boards 10, 20 and 30, and the blowers 51 and 52 which generate the air currents F1 which enter from the vent holes 44 into the case 40. Additionally, the motor controller 1 may include a plurality of electronic components 116 which may be aligned along the direction intersecting the front panel 42. In some examples, the air current F1 having passed the electronic component 116 on the windward side can be also used to cool the electronic component 116 on the leeward side. Consequently, both space savings and efficient cooling may be reliably achieved.

The upper limit of the output power of the electronic component 116 located closest to the front panel 42 among a plurality of electronic components 116 may be larger than the upper limits of the output power of the other electronic components 116. In some examples, by selectively or preferentially cooling the electronic component 116 of which heat generation amount is likely to be larger than those of a plurality of electronic components 116, a cooling efficiency of the plurality of electronic components 116 may be enhanced.

The plurality of electronic components 116 may include two outer electronic components, and an intermediate electronic component which is located between the two electronic components. The intermediate electronic component may have a smaller upper limit of the output power than those of the two outer electronic components. In some examples, by separating or spacing apart the electronic components 116 of which heat generation amounts are likely to be large and enhancing the cooling efficiency of each of the electronic components 116, the cooling efficiency of the plurality of electronic components 116 may be enhanced.

The plurality of electronic components 116 may include two electronic components 116 adjacent at the interval G1, and two electronic components 116 adjacent at the shorter interval G2 than the interval G1. In this case, by adjusting the interval(s) between the electronic components 116 to suppress heat transfer between the electronic components 116, the cooling efficiency of each electronic component 116 may be enhanced. For example, by making a relatively large interval between the electronic component 116 (e.g., electronic component 116A) of which the heat generation amount is likely to become large and an adjacent electronic component 116 (e.g., electronic component 116B) adjacent to this electronic component 116, heat transfer between the electronic components 116 is suppressed, so that the cooling efficiency of each electronic component 116 may be enhanced. In some examples, the interval between the electronic component 116A and the electronic component 116B may be relatively larger than the interval between the electronic component 116B and the electronic component 116C.

The board 20 may further include the power lines 22A and 22B which are wired so as to pass through a region between the two electronic components 116 adjacent at the interval G1 and are connected to a plurality of electronic components 116. In some examples, by utilizing the region between the two electronic components adjacent at the interval G1 larger than the interval G2 for wiring of the power lines 22A and 22B, further space may be saved.

The board 20 may include the connector 23 which is connected to the board 10, and the connector 23 may be provided, in a flow direction of the air currents F1 of the blowers 51 and 52, at a position at which at least part of the connector 23 overlaps a region between the two electronic components 116 adjacent at the interval G1. In some examples, the power lines 22A and 22B which pass between the two electronic components 116 adjacent at the interval G1 can be wired to the connector 23 via a short route. Consequently, this may be more effective for space saving.

The motor control device 1 may further include the electronic component 70 which includes the main body 71. The main body 71 includes the passive circuit element, and the cover 72 which covers at least part of the main body 71 and is heated by heat generated by the main body 71. Additionally, the main body 71 includes the cover 73 which has an electrical insulation property, and covers the cover 72 from the opposite side of the main body 71, and the ventilation route 74 which is formed between the cover 72 and the main body 71. In some examples, the insulating cover 73 covers the cover 72 from the opposite side of the main body 71, so that a distance between another element located on the side of the cover 72 (e.g., board 20) and the electronic component 70 may be reduced. The ventilation route 74 is secured between the cover 72 and the main body 71, so that heat radiation from both of the surface of the main body 71 on the side of the cover 72 and a surface of the cover 72 on the side of the main body 71 can suppress a rise in a temperature of the main body 71. Consequently, the space may be saved while suppressing the rise in the temperature of the main body 71.

The electronic component 70 may further include the spacers 75 which are interposed between the cover 72 and the main body 71 and conduct heat from the main body 71 to the cover 72. In some examples, the rise in the temperature of the main body 71 may be further suppressed.

The cover 72 includes the tubular part 72a which surrounds the main body 71 about the axis line along the ventilation route 74. In some examples, the tubular part 72a surrounds the main body 71, so that heat transfer efficiency from the main body 71 to the cover 72 and heat radiation efficiency from the cover 72 improve. Consequently, the rise in the temperature of the main body 71 may be further suppressed.

The cover 72 may have higher thermal conductivity than the cover 73. In some examples, the heat transfer efficiency from the main body 71 to the cover 72 and the heat radiation efficiency from the cover 72 improve. Consequently, the rise in the temperature of the main body 71 may be further suppressed.

The passive circuit element of the main body 71 may include the cement resistor. In some examples, by using a general-purpose circuit element, space may be saved while suppressing a rise in cost.

The motor control device 1 may further include the case 40 which includes the front panel 42 in which the vent holes 44A are formed, and houses the boards 10, 20 and 30. Additionally, the motor control device 1 may include the blower 53 which generates the air current F2 entering from the vent holes 44A into the case 40, and the air guide member 60 which guides the air current F2 having entered the case 40 via the vent hole 44A toward the electronic component 123. In some examples, even when the positions of the vent holes 44A are shifted from the positions meeting the electronic component 123 for space saving, an air current traveling toward the electronic component 123 is formed. Consequently, both space savings and efficient cooling may be more reliably achieved.

The board 30 may further include the heat radiator 35 which is in contact with the electronic component 123. The electronic component 123 and the air guide member 60 may be disposed at different positions when seen from the direction perpendicular to the front panel 42. Additionally, the board 30 may include the heat radiator 35 which protrudes at different lengths from the rim of the electronic component 123 toward the air guide member 60 and toward the opposite side of the air guide member 60. In some examples, both of the air current which is directed away from the electronic component 123 toward the air guide member 60 (referred to as an "air current A" below) and an air current which is directed away from the electronic component 123 toward the opposite side of the air guide member 60 (referred to as an "air current B" below) when seen from the direction perpendicular to the front panel 42, can be effectively used to cool the electronic component 123. An air flow of the air current A and an air flow of the air current B are assumed to differ. Accordingly, by adopting the structure that the heat radiator 35 protrudes at the different lengths from the rim of the electronic component 123 toward the air guide member 60 and toward the opposite side of the air guide member 60 when seen from the direction perpendicular to the front panel 42, the air currents A and B can be effectively used to further cool the electronic component 123.

The heat radiator 35 may include the base 36 which is in contact with the electronic component 123, and a plurality of heat radiator fins 37 which protrudes from the base 36. Additionally, the base 36 may protrude from the rims of the heat radiator fins 37 on the side of the front panel 42 toward the front panel 42. In some examples, the heat radiator fins 37 may be prevented from blocking the air currents guided by the air guide member 60 toward the electronic component 123 in order to improve heat radiation efficiency of the heat radiator 35.

In the robot system S1 including the robot 200 and the motor control device 1, the electronic component 116 located on the windward-most side of the air currents F1 of the blowers 51 and 52 may be associated with the movable portion 220 that is closer to the base portion 201 than the movable portions 220 associated with the other electronic components 116. In some examples, by selectively or preferentially cooling the electronic component 116 of which heat generation amount is likely to be become larger than those of other electronic components 116, a cooling efficiency of the plurality of electronic components 116 may be enhanced.

The electronic component 116 may be provided on the surface 20a of the board 20 facing away from the board 30, and the electronic component 123 may be provided on the surface 30a of the board 30 facing away from the board 20. In some examples, the electronic components 116 and 123 are partitioned by the boards 20 and 30. Consequently, heat transfer between the electronic components 116 and 123 may be suppressed, and the cooling efficiency of the electronic components 116 and 123 may be further enhanced.

A plurality of electronic components 116 and the heat radiator 21 may be disposed on an upper portion of the board 20 such that they are spaced apart from, or located from, the board 10. In some examples, heat transfer from the electronic components 116 to the electronic components disposed on the board 10 is suppressed. Consequently, a stability of operations of the electronic components disposed on the board 10 may be further enhanced.

When the electronic components 116 and the heat radiator 21 are unevenly disposed on the board 20 as described above, the capacitor 113 of the board 10 may be disposed at a position in which the capacitor 113 overlaps the heat radiator 21 when seen from the direction perpendicular to the board 10. In some examples, the space between the heat radiator 21 and the board 10 can be effectively used for the arrangement of the capacitor 113. Consequently, space may be further saved.

Furthermore, the air currents F1 for cooling the heat radiator 21 can also be used to cool the capacitor 113.

Furthermore, by disposing the capacitor 113 between the heat radiator 21 and the board 10, a ventilation resistance between the heat radiator 21 and the board 10 may be enhanced, and the air flow of the air current F1 on the side of the heat radiator 21 may be increased in order to enhance the cooling efficiency of the electronic components 116. The enhanced cooling efficiency of the electronic components 116 contributes to suppression of heat transfer from the electronic components 116 to the capacitor 113, and contributes to improvement of durability of the capacitor 113, too.

It is to be understood that not all aspects, advantages and features described herein may necessarily be achieved by, or included in, any one particular example embodiment. Indeed, having described and illustrated various examples herein, it should be apparent that other examples may be modified in arrangement and detail. For example, in addition to applications involving control of robots, a control target of the motor control device 1 may include other types of controlled devices.

We claim all modifications and variations coming within the spirit and scope of the subject matter claimed herein.

What is claimed is:

1. A motor control device comprising:
  a base board;
  a drive board including a switching device for power conversion, the drive board being disposed along a plane intersecting the base board and attached to the base board;
  a control board including a first processor configured to execute computation processing for controlling the switching device, the control board being disposed along a plane intersecting the base board and attached to the base board; and
  a second processor mounted on the base board and interposed between the first processor as mounted on the control board and the switching device as mounted on the drive board,
  wherein the second processor is configured to execute the computation processing for controlling the switching device, in cooperation with the first processor, in response to an input from the first processor.

2. The motor control device according to claim 1, further comprising a passive device including:
  a main body including a passive element,
  an inner cover covering at least part of the main body and configured to be heated by heat generated by the main body, an outer cover having an electrical insulation property and covering the inner cover from an opposite side of the main body, and a ventilation route formed between the inner cover and the main body.

3. The motor control device according to claim 2, wherein the passive device further includes a spacer interposed between the inner cover and the main body, and configured to conduct heat from the main body to the inner cover.

4. The motor control device according to claim 2, wherein the inner cover includes a tubular part surrounding the main body about an axis line oriented along the ventilation route.

5. The motor control device according to claim 2, wherein the inner cover has higher heat conductivity than the outer cover.

6. The motor control device according to claim 2, wherein the passive element includes a cement resistor.

7. A robot system comprising:
a robot including at least one actuator; and
the motor control device according to claim 1, the motor control device being configured to control the actuator.

8. The motor control device according to claim 1, wherein
the drive board includes a switching device cooler and at least two switching devices including the switching device and another switching device having a different upper limit of output power from that of the switching device, and
the switching device cooler is in contact with the at least two switching devices having different upper limits of the output power from each other.

9. The motor control device according to claim 1, wherein the base board includes:
a drive circuit connected to the switching device;
a control circuit connected to the first processor and located apart from the drive circuit; and
a transmitter configured to transmit a signal between the drive circuit and the control circuit in a state where the drive circuit and the control circuit are electrically insulated.

10. A motor control device comprising:
a base board;
a drive board including a switching device for power conversion, the drive board being disposed along a plane intersecting the base board and attached to the base board; and
a control board including a processor configured to execute computation processing for controlling the switching device, the control board being disposed along a plane intersecting the base board and attached to the base board,
wherein the base board includes:
a drive circuit connected to the switching device;
a control circuit connected to the processor and located apart from the drive circuit; and
a transmitter configured to transmit a signal between the drive circuit and the control circuit in a state where the drive circuit and the control circuit are electrically insulated.

11. The motor control device according to claim 10, wherein the drive board includes a plurality of switching devices including a first pair of adjacent switching devices separated from each other by a first interval, and a second pair of adjacent switching devices separated from each other by a second interval shorter than the first interval.

12. The motor control device according to claim 11, wherein the drive board further includes a power line wired so as to pass through a region between the first pair of adjacent switching devices, and connected to the plurality of switching devices.

13. The motor control device according to claim 12, wherein
the drive board includes a connector connected to the base board, and
the connector is oriented in a direction in which the plurality of switching devices is aligned such that at least part of the connector overlaps a region between the first pair of adjacent switching devices.

14. A motor control device comprising:
a base board; and
a drive board disposed along a plane intersecting the base board and attached to the base board, the drive board including:
a first switching device for power conversion;
a second switching device having a different upper limit of output power from that of the first switching device; and
at least one switching device cooler,
wherein the one switching device cooler is in contact with both the first switching device and the second switching device.

15. The motor control device according to claim 14, further comprising:
a case including a first wall portion including a vent hole formed therein, the case housing the base board and the drive board and the control board; and
a blower configured to generate an air current entering from the vent hole into the case,
wherein the first and second switching devices are aligned along a direction intersecting the first wall portion.

16. The motor control device according to claim 15, wherein the first switching device is located closer to the first wall portion than the second switching device, and wherein an upper limit of output power of the first switching device is larger than an upper limit of output power of the second switching device.

17. The motor control device according to claim 14, wherein the drive board additionally includes an intermediate switching device located between the first and second switching devices, the intermediate switching device having a smaller upper limit of output power than either of the first and second switching devices.

18. A motor control device comprising:
a base board,
a drive board including a switching device for power conversion, the drive board being disposed along a plane intersecting the base board and attached to the base board;
a control board including a processor configured to execute computation processing for controlling the switching device and a processor cooler in contact with the processor, the control board disposed along a plane intersecting the base board and attached to the base board,
a case including a first wall portion including a vent hole formed therein, the case housing the base board, the drive board and the control board;
a blower configured to generate an air current entering from the vent hole into the case; and
an air guide member configured to guide an air current from the vent hole toward the processor,
wherein the processor and the air guide member are disposed at different positions when seen from a direction perpendicular to the first wall portion, and wherein the processor cooler protrudes at different lengths from an outer periphery of the processor toward the air guide member and toward an opposite side of the air guide member.

19. The motor control device according to claim 18, wherein
the processor cooler includes a base in contact with the processor, and a plurality of heat radiator fins protruding from the base, and
the base protrudes from outer peripheries of the heat radiator fins on a side of the first wall portion toward the first wall portion.

20. The motor control device according to claim 18, wherein the base board includes:
a drive circuit connected to the switching device;
a control circuit connected to the processor and located apart from the drive circuit; and
a transmitter configured to transmit a signal between the drive circuit and the control circuit in a state where the drive circuit and the control circuit are electrically insulated.

* * * * *